（12）United States Patent
Katagiri et al.

(10) Patent No.: US 10,585,327 B2
(45) Date of Patent: Mar. 10, 2020

(54) LIGHT MODULATION FILM AND METHOD FOR MANUFACTURING SAME, AND LIGHT MODULATION ELEMENT

(71) Applicant: NITTO DENKO CORPORATION, Ibaraki-shi, Osaka (JP)

(72) Inventors: Masayoshi Katagiri, Ibaraki (JP); Nozomi Fujino, Ibaraki (JP); Tomotake Nashiki, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/576,029

(22) PCT Filed: May 18, 2016

(86) PCT No.: PCT/JP2016/064730
§ 371 (c)(1),
(2) Date: Dec. 21, 2017

(87) PCT Pub. No.: WO2016/186130
PCT Pub. Date: Nov. 24, 2016

(65) Prior Publication Data
US 2018/0173076 A1  Jun. 21, 2018

(30) Foreign Application Priority Data

May 21, 2015 (JP) ................ 2015-103585
May 13, 2016 (JP) ................ 2016-097240

(51) Int. Cl.
*G02F 1/19* (2019.01)
*G02B 5/26* (2006.01)
(Continued)

(52) U.S. Cl.
CPC ........... *G02F 1/19* (2013.01); *C23C 14/0036* (2013.01); *C23C 14/082* (2013.01);
(Continued)

(58) Field of Classification Search
CPC ..... G02F 1/19; C23C 14/0036; C23C 14/082; C23C 14/205; C23C 14/562; C23C 14/34; G02B 5/26
(Continued)

(56) References Cited

U.S. PATENT DOCUMENTS

2014/0247474 A1  9/2014  Yamada et al.
2015/0168801 A1*  6/2015  Yamada ............... G02F 1/19
                                                   359/240

FOREIGN PATENT DOCUMENTS

EP   2559778 A1   2/2013
JP   2000-192237 A   7/2000
(Continued)

OTHER PUBLICATIONS

Translation of International Preliminary Report on Patentability with Written Opinion of the International Searching Authority dated Nov. 30, 2017, corresponding to International Application No. PCT/JP2016/064730.
(Continued)

*Primary Examiner* — George G King
(74) *Attorney, Agent, or Firm* — Hauptman Ham, LLP

(57) ABSTRACT

A light modulation film (1) includes a light modulation layer (30) whose state is reversibly changed between a transparent state by hydrogenation and a reflective state by dehydrogenation, and a catalyst layer (40) that promotes hydrogenation and dehydrogenation in the light modulation layer, in this order on a polymer film substrate (10). light modulation layer (30) includes a light modulation region (32) having a thickness of 10 nm or more on a catalyst layer (40)-side, and an oxidized region (31) on a polymer film substrate (10)-side.

12 Claims, 2 Drawing Sheets

(51) Int. Cl.
*C23C 14/56* (2006.01)
*C23C 14/08* (2006.01)
*C23C 14/20* (2006.01)
*C23C 14/00* (2006.01)
*C23C 14/34* (2006.01)

(52) U.S. Cl.
CPC .......... *C23C 14/205* (2013.01); *C23C 14/562* (2013.01); *G02B 5/26* (2013.01); *C23C 14/34* (2013.01)

(58) Field of Classification Search
USPC ........................................................ 359/321
See application file for complete search history.

(56) References Cited

FOREIGN PATENT DOCUMENTS

| JP | 2009-003214 A | 1/2009 |
|----|---------------|--------|
| JP | 4628741 B2 | 2/2011 |
| JP | 2011-74415 A | 4/2011 |
| JP | 2013-083911 A | 5/2013 |
| JP | 2014-26262 A | 2/2014 |
| WO | WO-2013191085 A1 * | 12/2013 ............... G02F 1/19 |
| WO | 2014/163189 A1 | 10/2014 |
| WO | 2015/008708 A1 | 1/2015 |

OTHER PUBLICATIONS

Shanhu Bao et al, "Gasochromic Properties of Mg—Ni Switchable Mirror Thin Films on Flexible Sheets", Japanese Journal of Applied Physics, 2008, pp. 7993-7997, vol. 47, No. 10, cited in NPL No. 3.
Kazuki Tajima et al., "Analysis of Degradation of Flexible All-Solid-State Switchable Mirror Based on Mg—Ni Thin Film", Japanese Journal of Applied Physics, 2009, p. 102402, vol. 48, No. 10, cited in NPL No. 3.
The extended European search report for corresponding European application No. 16796523.5 dated Jan. 11, 2019.
International Search Report dated Aug. 9, 2016 corresponding to International Application No. PCT/KR2016/064730.
Japanese Office Action dated Dec. 10, 2019 for corresponding Japanese Application No. 2016-097240, with English Machine translation.
Chinese Office Action dated Nov. 25, 2019 for corresponding Chinese Application No. 201680029550.3 with English Machine translation.

* cited by examiner

LIGHT MODULATION FILM AND METHOD FOR MANUFACTURING SAME, AND LIGHT MODULATION ELEMENT

CROSS REFERENCE TO RELATED APPLICATION

This application claims the priority of International Application No. PCT/JP2016/064730, filed on May 18, 2016, which claims priority to Japanese Application Nos. 2015-103585, filed on May 21, 2015 and 2016-097240, filed on May 13, 2016. The entire disclosures of each of the above applications are incorporated herein by reference.

TECHNICAL FIELD

The present invention relates to a light modulation film which is used for a hydrogen-activation-type light modulation element capable of switching between a transparent state and a reflective state by hydrogenation and dehydrogenation, and a method for manufacturing the light modulation film. The present invention also relates to a light modulation element including the light modulation film.

BACKGROUND ART

Light modulation elements are used for window panes of buildings and vehicles, interior materials, and the like. Particularly in recent years, demand and expectation for light modulation elements have been increased from the viewpoints of reducing a cooling and heating load, reducing a lighting load, improving comfort, and so on.

As the light modulation element, the following systems have been developed: an electric field drive system in which a liquid crystal material or an electrochromic material is used, and the light transmittance is controlled by application of an electric field; a thermochromic system using a thermochromic material, of which the light transmittance is changed with a temperature; a gas chromic system in which the light transmittance is controlled by controlling an atmospheric gas.

Examples of the method for controlling the light transmittance include a method of switching between transmission and scattering of light by a light modulation material, a method of switching between transmission and absorption of light, and a method of switching between transmission and reflection of light. Among them, a hydrogen-activation-type light modulation element that switches between transmission and reflection of light by hydrogenation and dehydrogenation of a light modulation material has an advantage that light from outside can be reflected to prevent inflow of heat, and therefore excellent heat shielding property is exhibited, so that a high energy saving effect is obtained. In addition, since it is able to switch between hydrogenation and dehydrogenation by a gas chromic system, it is possible to increase the area and reduce the cost.

As hydrogen-activation-type light modulation materials capable of reversibly switching between a transparent state and a reflective state by hydrogenation and dehydrogenation, rare earth metals such as yttrium, lanthanum and gadolinium, alloys of a rare earth metal and magnesium, alloys of an alkaline earth metals such as calcium, strontium or barium and magnesium, and alloys of a transition metal such as nickel, manganese, cobalt or iron and magnesium are known. Particularly, when a magnesium alloy is used as the light modulation material, a light modulation element having a high light transmittance in a transparent state is obtained because magnesium hydride has a visible light transmittance.

In the hydrogen-activation-type light modulation element, a catalyst layer is provided in proximity to a light modulation layer composed of a light modulation material. The catalyst layer has a function of promoting hydrogenation and dehydrogenation of the light modulation layer. As the catalyst layer, palladium, platinum, a palladium alloy, a platinum alloy or the like is used. As such a hydrogen-activation-type light modulation element, one including a light modulation layer and a catalyst layer on a glass substrate has been heretofore studied (e.g., Patent Document 1). For the hydrogen-activation-type light modulation material, it is known that when switching between a transparent state by hydrogenation and a reflection state by dehydrogenation is repeated, switching characteristics may be deteriorated because magnesium in a magnesium alloy in a light modulation layer passes through a catalyst layer, and is deposited on the surface, and oxidized. It has been suggested that a buffer layer such as a metal thin-film or a hydrogenated metal thin-film is provided between a light modulation layer and a catalyst layer for suppressing migration of magnesium to the catalyst layer (e.g., Patent Document 2).

PRIOR ART DOCUMENTS

Patent Documents

Patent Document 1: JPA 2013-83911
Patent Document 2: JPA 2014-26262

SUMMARY OF THE INVENTION

Problems to be Solved by the Invention

It may be useful to use a film substrate in place of a glass substrate for attaining mass production and cost reduction of a hydrogen-activation-type light modulation element. When a film substrate is used, and a continuous deposition method such as roll-to-roll sputtering is employed, a light modulation film including a light modulation layer and a catalyst layer with a uniform thickness and uniform characteristics can be provided with a large length, and therefore it is easy to increase an area. In addition, when a film substrate is used, the film is easily bonded to general glass or the like, and applicable to a curved surface, resulting in excellent versatility.

Patent Document 2 suggests that the substrate may be a flexible film, but this document does not show a specific example in which a light modulation layer is formed on a film substrate. The present inventors attempted to prepare a light modulation film including a hydrogen-activation-type light modulation layer on a film substrate, and resultantly found that the light modulation film had lower light modulation performance, or did not exhibit light modulation as compared to a case where a light modulation layer was formed on a glass substrate under the same conditions. In view of such a problem, an object of the present invention is to provide a hydrogen-activation-type light modulation film including a light modulation layer on a film substrate and having light modulation performance comparable to light modulation performance obtained when a glass substrate is used.

Means for Solving the Problems

The present inventors have conducted studies to find that the reason why light modulation performance is deteriorated when a light modulation layer is deposited on a film substrate is that the film substrate contains water, oxygen and so on, and therefore the light modulation layer is easily oxidized. In view of such findings, the present inventors have further conducted studies, and resultantly found that oxidation of a light modulation layer at the interface on the catalyst layer side is suppressed by forming an oxidized region in the initial stage of deposition of the light modulation layer on a substrate film.

The light modulation film of the present invention includes a light modulation layer and a catalyst layer in this order on a polymer film substrate. The state of the light modulation layer is reversibly changed between a transparent state by hydrogenation and a reflective state by dehydrogenation. The catalyst layer promotes hydrogenation and dehydrogenation in the light modulation layer.

The light modulation layer has a light modulation region with an oxygen content of less than 50 atom % and a thickness of 10 nm or more on the catalyst layer side, and has an oxidized region with an oxygen content of 50 atom % or more on the polymer film substrate side. The thickness of the oxidized region in the light modulation layer is preferably 2 to 100 nm. The thickness of each of the light modulation region and the oxidized region in the light modulation layer is determined from a thickness-direction element concentration distribution measured by X-ray electron spectroscopy (XPS) while etching the light modulation layer from the catalyst layer side toward the polymer film substrate side.

For the light modulation layer, a metal thin-film of a rare earth metal, an alloy of a rare earth metal and magnesium, an alloy of an alkaline earth metal and magnesium, an alloy of a transition metal and magnesium, or the like is preferably used. The light modulation layer may contain the above-mentioned metal in the form of a hydride. In addition, the oxidized region of the light modulation layer contains the above-mentioned metal in the form of an oxide.

Preferably, the oxidized region and the light modulation region in the light modulation layer have the same metal element composition. The thickness of the oxidized region is preferably smaller than the thickness of the light modulation region.

The light modulation film of the present invention is obtained by, for example, depositing a light modulation layer having an oxidized region and a light modulation region, and a catalyst layer on a film substrate by roll-to-roll sputtering.

Further, the present invention relates to a light modulation element including the light modulation film. The light modulation film of the present invention is suitable for a gas chromic-type light modulation element because the light modulation layer can be hydrogenated and dehydrogenated by a gas chromic system. One embodiment of a gas chromic-type light modulation element includes a plurality of transparent members (e.g., multi-layered glass), where gaps between the transparent members form a gas-filling chamber. A light modulation element is formed by disposing a light modulation film in the gas-filling chamber. Preferably, the gas chromic-type light modulation element further includes an atmosphere control device. The atmosphere control device is configured such that hydrogen can be supplied to and discharged from the inside of the gas-filling chamber.

Effects of the Invention

In a light modulation film of the present invention, an oxidized region existing at the interface on the film substrate side of the light modulation layer has an action of blocking an oxidizing gas from a polymer film substrate. Thus, oxidation of a light modulation region at the interface on the catalyst layer side of the light modulation layer is suppressed, so that excellent light modulation performance can be exhibited.

MODE FOR CARRYING OUT THE INVENTION

[Configuration of Light Modulation Film]

Figure 1:
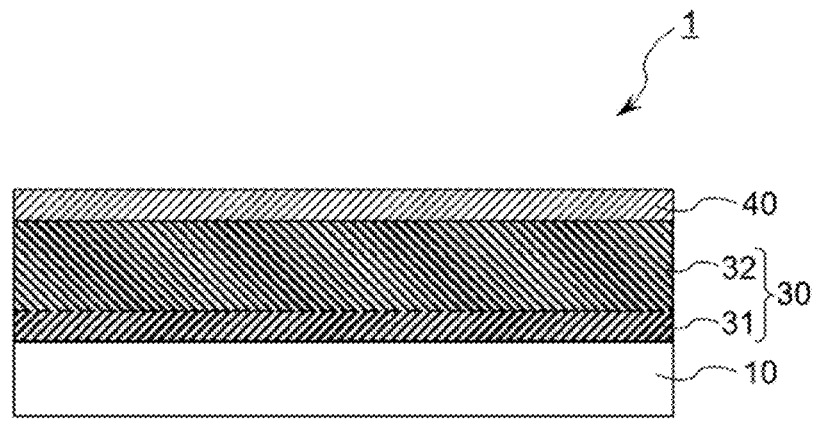
FIG. 1 is a schematic sectional view showing one embodiment of a light modulation film.

FIG. 1 is a schematic sectional view showing one embodiment of a light modulation film of the present invention. The light modulation film 1 of the present invention includes a light modulation layer 30 and a catalyst layer 40 on a polymer film substrate 10. The light modulation layer 30 has a light modulation region 32 on the catalyst layer 40 side, and has an oxidized region 31 on the polymer film substrate 10 side.

<Film Substrate>

The polymer film substrate 10 may be transparent or opaque. A transparent plastic material is preferably used as a material of the polymer film substrate for making the light modulation film light-transmissive in a state in which the light modulation layer is hydrogenated. Examples of the plastic material include polyesters such as polyethylene terephthalate, polyolefins, cyclic polyolefins such as norbornene-based cyclic polyolefins, polycarbonate, polyether sulfone, and polyarylates.

The thickness of the polymer film substrate 10 is not particularly limited. The thickness of the polymer film is generally about 2 to 500 μm, and is preferably about 20 to 300 μm. A surface of the polymer film substrate 10 may be provided with an easily adhesive layer, an antistatic layer, a hard coat layer and the like. In addition, a surface of the polymer film substrate 10 may be subjected to an appropriate adhesion treatment such as a corona discharge treatment, an ultraviolet irradiation treatment, a plasma treatment, sputtering etching treatment or the like for improving adhesion with the light modulation layer 30.

The arithmetic mean roughness Ra of the polymer film substrate 10 on the light modulation layer 30-formed surface side is preferably 5 nm or less, more preferably 3 nm or less, further preferably 1 nm or less. When the surface roughness of the substrate is reduced, film quality in the initial stage of deposition of the light modulation layer becomes uniform. Thus, a surface of the substrate 10 can be uniformly covered with the oxidized region 31. The arithmetic mean roughness Ra can be determined from a 1 μm-square AFM observation image obtained using a scanning probe microscope (AFM).

<Light Modulation Layer>

The material of the light modulation layer 30 is not particularly limited as long as it contains a chromic material, the state of which is reversibly changed between a transparent state by hydrogenation and a reflective state by dehydrogenation. Specific examples of the material that constitutes the light modulation layer include rare earth metals such as Y, La, Gd and Sm, alloys of a rare earth metal and magnesium, alloys of an alkaline earth metal such as Ca, Sr or Ba and magnesium, and alloys of a transition metal such as Ni, Mn, Co or Fe and magnesium. The light modulation layer 30 may contain an element other than the above-mentioned alloy as a minor component.

The metal or alloy that constitutes the light modulation layer 30 contains a metal element which is transformed into a transparent state by hydrogenation, and is transformed back into a reflective state by releasing hydrogen. For example, magnesium is transformed into transparent $MgH_2$ when hydrogenated, and is transformed back into Mg with a metallic reflection when dehydrogenated.

On the other hand, oxidation of the light modulation layer causes deterioration of light modulation performance (a difference between transmittances in hydrogenation and in dehydrogenation). In particular, magnesium has a high bonding strength with oxygen, and once magnesium is oxidized, it is no longer hydrogenated even when hydrogen is introduced, and therefore the light modulation performance of a light modulation layer containing magnesium tends to considerably deteriorated by oxidation. In addition, when the interface of the light modulation layer on the catalyst layer side is oxidized, movement of hydrogen between the catalyst layer and the light modulation layer is hindered by an oxide film, and therefore light modulation performance cannot be exhibited. When a light modulation layer is formed on a polymer film substrate, an oxidizing gas such as moisture or oxygen is released from the polymer film during deposition and in a use environment, and thus the light modulation layer is oxidized, so that light modulation performance may be deteriorated for the above-described reason.

In the present invention, the light modulation layer 30 has the oxidized region 31 having an oxygen content of 50 atom % or more on the polymer film substrate 10 side, and has the light modulation region 32 having an oxygen content of less than 50 atom % on the oxidized region 31. The oxidized region of the light modulation layer includes a dense oxide film of magnesium oxide or the like, and therefore when the oxidized region 31 is present at the interface of the light modulation layer 30 with the polymer film substrate 10, moisture, oxygen and the like generated from the polymer film substrate 10 are blocked by the oxidized region 31, so that the oxidation of the light modulation region 32 is suppressed. In other words, since the oxidized region 31 of the light modulation layer 30 at the interface with the polymer film substrate 10 functions as a sacrificial layer, oxidation of the light modulation region 32 situated on the catalyst layer 40 side can be suppressed to maintain high light modulation performance.

Light modulation performance can be evaluated by a difference between transmittances in hydrogenation (transparent state) and in dehydrogenation (reflective state). The amount of the difference between transmittances in hydrogenation and in dehydrogenation is preferably 1% or more, more preferably 5% or more, further preferably 10% or more. The difference between the transmittances is preferably as large as possible. Considering the light transmittance of a hydrogenated metal and the light reflection at the interface, the upper limit of the viable amount of a difference between the transmittances is about 80%.

The oxygen content in the light modulation layer 30 is determined by measuring a thickness-direction distribution (depth profile) of an element concentration by X-ray electron spectroscopy (XPS) while etching the light modulation layer from the surface side (catalyst layer 40 side) toward the substrate side of the light modulation film. The etching depth (nm) in the depth profile is calculated by multiplying an etching time (min) by a standard etching rate (nm/min) for $SiO_2$. In the resulting depth profile, a position which is situated between a layer adjacent to the light modulation layer and the light modulation layer and at which the concentration of an element contained in the largest amount in the layer adjacent to the light modulation layer is a half value of the maximum value is defined as an interface between the light modulation layer and the adjacent layer (start point and end point of the light modulation layer). The distance between the start point of the light modulation layer and a point at which the oxygen content is 50 atom % or more is defined as a thickness of the light modulation region 32, and the thickness of a region where the oxygen content is 50 atom % or more is defined as a thickness of the oxidized region 31.

When the light modulation region 32 in which an oxygen concentration is less than 50% has a thickness of 10 nm or more, it is possible to switch between a transparent state and a reflective state by hydrogenation and dehydrogenation of the light modulation layer 30. On the other hand, for increasing the light transmittance in the transparent state, the thickness of the light modulation region 32 is preferably 500 nm or less. The thickness of the light modulation region 32 is more preferably from 15 nm to 200 nm, further preferably from 20 nm to 100 nm for securing both the light transmittance in the transparent state and the light shielding ratio (reflectance) in the reflective state.

The thickness of the oxidized region 31 in the light modulation layer 30 is not particularly limited as long as barrier property against oxygen, moisture and the like can be imparted to suppress outgas from a polymer film. For ensuring that the oxidized region is a continuous film, the thickness of the oxidized region 31 is preferably 2 nm or more. On the other hand, when the thickness of the oxidized region is excessively large, productivity and light modulation property tend to be deteriorated, and therefore the thickness of the oxidized region is preferably 100 nm or less. The thickness of the oxidized region is more preferably 4 to 80 nm, further preferably 6 to 60 nm.

As described above, the oxidized region 31 of the light modulation layer 30 acts as a sacrificial layer, and is hardly hydrogenated even when hydrogen is introduced, and thus the oxidized region 31 has almost no light modulation performance. Thus, it is preferable that the thickness of the oxidized region 31 is as small as possible within a range which ensures that outgas from the polymer film substrate can be suppressed. In this respect, the thickness of the oxidized region is preferably 40 nm or less, more preferably 30 nm or less, further preferably 25 nm or less, especially preferably 20 nm or less. The thickness of the oxidized region 31 is preferably smaller than the thickness of the light modulation region 32 formed on the oxidized region 31. The thickness of the oxidized region 31 is more preferably 0.8 times or less, still more preferably 0.6 times or less, further preferably 0.5 times or less of the thickness of the light modulation region.

Preferably, the oxidized region 31 and the light modulation region 32 of the light modulation layer 30 have the same metal element composition. For example, when in the case of forming the light modulation layer 30 by a sputtering method, targets having the same composition are used, and an oxide layer is formed in the initial stage of deposition, a light modulation region having the same metal element composition as that of the oxidized region and having a low oxygen content can be formed on the oxidized region.

The same metal composition means that the types of metal elements contained in an amount of 5 atom % or more in the light modulation layer, such as those of magnesium, rare earth metals, alkaline earth metals and transition metals are the same, and the oxidized region and the light modulation region may have different ratios of such elements. For example, when both the oxidized region and the light modulation region include Mg—Y alloys (or hydrides or oxides thereof), both the layers are considered to have the same metal element composition in the present invention even if both the regions have different ratios of Mg and Y as long as the contents of both Mg and Y in each of the regions are 5 atom % or more.

The oxidized region 31 and the light modulation region 32 of the light modulation layer 30 may have different ratios of metal elements. For example, when the oxidized region 31 is formed on the polymer film substrate 10 by depositing a layer which has a relatively high magnesium content and is easily oxidized, and a layer having a relatively low magnesium content is successively formed on the oxidized region 31, the effect of blocking outgas from the substrate by the oxidized region 31 can be improved to suppress oxidation of the light modulation region 32. In addition, the light modulation region may be one in which the ratio of metal elements changes continuously or discontinuously in the thickness direction. For example, the light modulation region may be formed by stacking a plurality of layers having different ratios of metal elements.

<Catalyst Layer>

The catalyst layer 40 has a function of promoting hydrogenation and dehydrogenation in the light modulation layer 30. The catalyst layer 40 increases the switching speed in switching from the reflective state to the transparent state (hydrogenation of the light modulation layer) and switching from the transparent state to the reflective state (dehydrogenation of the light modulation layer).

The material of the catalyst layer 40 is not particularly limited as long as the catalyst layer 40 has a function of promoting hydrogenation and dehydrogenation of the light modulation layer 30, and it is preferable that catalyst layer 40 has at least one metal selected from, for example, palladium, platinum, a palladium alloy and a platinum alloy. In particular, palladium is preferably used because it has high hydrogen permeability.

The thickness of the catalyst layer 40 can be appropriately set according to the reactivity of the light modulation layer 30 (light modulation region 32), the catalytic ability of the catalyst layer 40, and the like. Although the thickness of the catalyst layer 40 is not particularly limited, it is preferably 1 to 30 nm, more preferably 2 to 20 nm. When the thickness of the catalyst layer is excessively small, the catalytic function for hydrogenation and dehydrogenation is not sufficiently exhibited in some cases, and when the thickness of the catalyst layer is excessively large, the light transmittance tends to decrease.

<Buffer Layer and Surface Layer>

Figure 2:
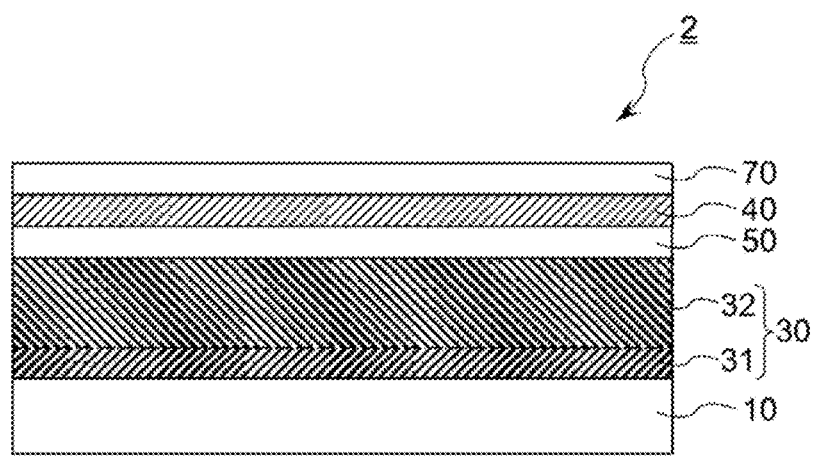
FIG. 2 is a schematic sectional view showing one embodiment of a light modulation film.

The light modulation film of the present invention may include a layer other than the light modulation layer 30 and the catalyst layer 40 on the polymer film substrate 10. For example, as in the light modulation film 2 shown in FIG. 2, a buffer layer 50 may be provided between the light modulation layer 30 and the catalyst layer 40, or a surface layer 70 may be provided on the catalyst layer 40.

The buffer layer 50 is preferably permeable to hydrogen and capable of suppressing oxidation of the light modulation layer and migration of a metal from the light modulation layer to the catalyst layer. For example, when a metal thin-film including Ti, Nb, V, an alloy of these metals, or the like is inserted as the buffer layer 50 between the light modulation layer 30 and the catalyst layer 40, the switching speed from the transparent state to the reflective state in dehydrogenation tends to increase while migration of magnesium etc. from the light modulation layer and the catalyst layer is suppressed.

When a metal thin-film including W, Ta, Hf, an alloy of these metals, or the like is inserted as the buffer layer 50, passage of oxygen to the light modulation region 32 of the light modulation layer 30 from the catalyst layer 40 side can be suppressed to inhibit degradation of the light modulation region by oxidation. When a metal thin-film including a metallic material similar to that in the light modulation layer, for example Sc, an Mg—Sc alloy or a hydride thereof is inserted as the buffer layer 50, the layer functions as a sacrificial layer which reacts with oxygen passing through the catalyst layer 40, so that oxidation of the light modulation region 32 can be suppressed. Preferably, the buffer layer acting as such a sacrificial layer is reversibly bonded with oxygen, and hydrogenated in hydrogenation of the light modulation region 32 (transparent state), so that the light transmittance increases. Thus, when a magnesium alloy is used for the buffer layer, the content of magnesium based on the total amount of metallic elements is preferably less than 50 atom %.

The thickness of the buffer layer 50 can be appropriately set according to its purpose and so on, and is not particularly limited. The thickness is, for example, 1 to 200 nm, and preferably 2 to 30 nm. The buffer layer may include only one layer or a plurality of layers. For example, the buffer layer 50 may be a stack of a layer having a function of suppressing migration of a metal such as magnesium from the light modulation layer 30 and a layer suppressing passage of oxygen from the catalyst layer 40 side to the light modulation layer 30.

When the surface layer 70 is provided on the catalyst layer 40, the surface layer 70 may be permeable to hydrogen. Preferably, the surface layer 70 has a function of blocking passage of water and oxygen to prevent oxidation of the light modulation layer 30. In addition, by adjusting the optical thickness of the surface layer 70, light reflection at a surface of the light modulation film can be reduced to increase the light transmittance in the transparent state.

As a material of the surface layer 70, a metal shown as an example as the material of the buffer layer, an inorganic oxide, or the like can be used. Examples of the inorganic oxide include oxides of metal elements and semimetal element such as Si, Ge, Sn, Pb, Al, Ga, In, Tl, As, Sb, Bi, Se, Te, Mg, Ca, Sr, Ba, Sc, Y, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn.

As a material of the surface layer 70, an organic material such as a polymer, an organic-inorganic hybrid material, or the like may also be used. When a material having water repellency such as a fluorine-based resin is used for the surface layer 70, the function of suppressing oxidation of the light modulation layer 30 by water or oxygen can be further enhanced to improve the durability of the light modulation element.

The thickness of the surface layer 70 can be appropriately set according to its purpose and so on, and is not particularly limited. The thickness is, for example, about 1 nm to 50 μm. The surface layer may include only one layer, or a plurality of layers. For example, when a plurality of thin-films having different refractive indices are stacked, and the optical thickness of each layer is adjusted, antireflection property can be improved to increase the light transmittance in the transparent state. In addition, durability can also be improved by combining an organic layer and an inorganic layer.

[Method for Preparing Light Modulation Film]

A light modulation film can be prepared by depositing the light modulation layer 30 having the oxidized region 31 and the light modulation region 32, and the catalyst layer 40 sequentially on the polymer film substrate 10. When the buffer layer is deposited after deposition of the light modulation layer 30 and before deposition of the catalyst layer 40, a light modulation film including the buffer layer 50 is obtained.

The method for depositing these layers is not particularly limited, and for example, deposition methods such as a sputtering method, a vacuum vapor deposition method, an electron beam vapor deposition method, a chemical vapor deposition (CVD) method, a chemical bath deposition (CBD) method and a plating method can be employed. Among them, a sputtering method is preferable because a uniform and dense film can be deposited. Particularly, when a roll-to-roll sputtering apparatus is used, and deposition is performed while a long polymer film substrate is continuously moved in the longitudinal direction, productivity of the light modulation film can be improved. In roll-to-roll sputtering, a plurality of thin-films can be deposited in one film conveyance when a plurality of cathodes are arranged along the circumferential direction of one deposition roll, or a sputtering apparatus including a plurality of deposition rolls is employed. Therefore, productivity may be further improved.

It is preferable that after the sputtering apparatus is loaded with a roll-shaped film substrate and before sputtering deposition is started, the inside of the sputtering apparatus is evacuated to remove moisture, and impurities such as organic gases generated from the substrate. By removing gases in the apparatus and the substrate in advance, oxidation due to incorporation of oxygen and moisture into the light modulation layer 30 can be suppressed. The degree of vacuum (ultimate vacuum) in the sputtering apparatus before starting of sputtering deposition is, for example, $1\times10^{-2}$ Pa or less, preferably $5\times10^{-3}$ Pa or less, more preferably $1\times10^{-3}$ Pa or less, further preferably $5\times10^{-4}$ Pa or less, especially preferably $5\times10^{-5}$ Pa or less.

A metal target is used for deposition of the light modulation layer 30 on the polymer film substrate 10. When an alloy layer is deposited as the light modulation layer, an alloy target may be used, or a plurality of metal targets may be used. In addition, an alloy layer may also be formed using a target (split target) in which a plurality of metal plates are arranged and bonded on a backing plate in such a manner that an erosion portion has a predetermined area ratio. When a plurality of metal targets are used, an alloy layer having a desired composition can be formed by adjusting an electric power applied to each target. The light modulation layer is deposited while an inert gas is introduced.

An oxidized region having an oxygen content of 50 atom % or more is formed in the initial stage of deposition of the light modulation layer 30. In formation of the oxidized region, a reactive gas (e.g., oxygen) may be introduced as a sputtering gas in addition to an inert gas such as argon. Even when a reactive gas is not introduced, the oxidized region can be formed by oxidizing a metal with oxygen, moisture or the like released from the polymer film substrate.

A light modulation region is formed on the oxidized region. The light modulation region may be formed in a deposition chamber different from or identical to the deposition chamber in which the oxidized region is formed. For example, when the oxidized region is formed by outgas from the substrate without introducing a reactive gas such as oxygen, the amount of outgas generated from the substrate decreases as the thickness of the oxidized region increases, and therefore a light modulation region having an oxygen content of 50 atomic % or less can be formed even when the same deposition conditions are maintained.

On the light modulation layer, the buffer layer 50 is deposited as necessary, and the catalyst layer 40 is deposited thereon. For deposition of the buffer layer and the catalyst layer, a metal target is used, and deposition is performed while an inert gas is introduced.

When the surface layer 70 is provided on the catalyst layer 40 after formation of the catalyst layer 40 and preceding layers by the sputtering method, the surface layer 70 may be deposited by a sputtering method, or other method. When the surface layer is formed of an organic material such as a polymer, or an organic-inorganic hybrid material, it is preferable that deposition is performed by a wet method such as spin coating, dip coating, gravure coating or die coating. When the surface layer is formed of an inorganic material, a wet method such as the above-mentioned coating method, CBD method, plating method, or the like may be employed, or a sputtering method, a vacuum vapor deposition method, an electron beam vapor deposition method, a CVD method or the like can also be employed.

[Light Modulation Element]

The light modulation film of the present invention can be used for a hydrogen-activation-type light modulation element capable of switching a light-transmissive state and a light-reflective state by hydrogenation and dehydrogenation of the light modulation layer. The method for hydrogenating and dehydrogenating the light modulation layer is not particularly limited. Examples thereof include a method in which the light modulation film is exposed to a hydrogen atmosphere to hydrogenate the light modulation layer, and the light modulation film is exposed to an oxygen atmosphere (air) to dehydrate the light modulation layer (gas chromic method); and a method in which the light modulation layer 30 is hydrogenated and dehydrogenated using a liquid electrolyte (electrolytic solution) or a solid electrolyte (electrochromic method). Among them, the gas chromic method is preferable because it is possible to switch a light modulation layer having a large area in a short time.

The light modulation film of the present invention as it is may be used as a light modulation element, or may be combined with a transparent member such as glass, a translucent member, an opaque member or the like to form a light modulation element. In the light modulation film of the present invention, the light modulation layer can be transformed into a transparent state by hydrogenation to transmit light. Therefore, in a light modulation element combined with a transparent member, switching between a transparent state and a reflective state can be performed by hydrogenation and dehydrogenation of the light modulation layer.

When the light modulation film is combined with other member to form a light modulation element, it is preferable to fix the light modulation film by bonding with an adhesive or an adhesive tape, or pinning for preventing displacement. As fixing means for fixing the light modulation film and other member, an adhesive is preferable because the fixing area can be increased. As the adhesive, a pressure sensitive adhesive is preferably used. By providing a pressure sensitive adhesive on the polymer film substrate 10 of the light modulation film 1 or 2 in advance, glass or the like and the light modulation film can be easily bonded to each other. As the pressure sensitive adhesive, one having excellent transparency, such as an acryl-based pressure sensitive adhesive is preferably used.

The light modulation element including the light modulation film of the present invention can be applied to window panes of buildings and vehicles, shields for the purpose of protecting privacy, various kinds of decorations, lighting equipment, entertainment tools and the like. Since a flexible substrate is used in the light modulation film of the present invention, the light modulation film is easily processed, and can be applied to a curved surface, resulting in excellent versatility.

A gas chromic-type light modulation element can also be formed by disposing the light modulation film of the present invention in a gas-filling chamber. When gaps between a plurality of transparent members are set as a gas-filling chamber, and the light modulation element is disposed in the gas-filling chamber, it is possible to switch between the transparent state and the reflective state by supplying hydrogen to and discharging hydrogen from the inside of the gas-filling chamber.

Figure 3:
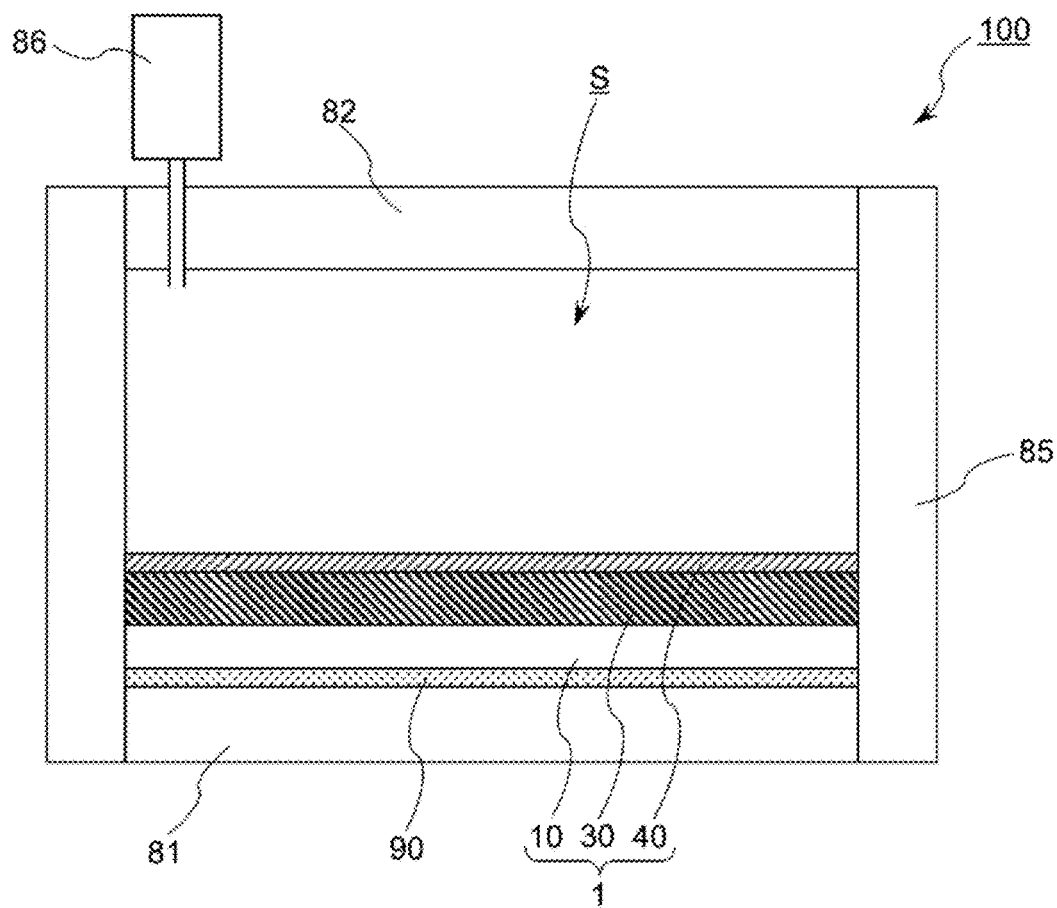
FIG. 3 is a schematic sectional view showing one embodiment of a multi-layered glass that includes a light modulation film.

As one embodiment of the gas chromic-type light modulation element including the light modulation film of the present invention, a light modulation element in which a light modulation film is disposed in a space between glasses in a multi-layered glass will be described. FIG. 3 is a schematic sectional view showing one embodiment of a multi-layered glass that functions as a light modulation element. A multi-layered glass 100 includes two glass plates 81 and 82. An inside surface of one glass plate 81, i.e., a surface facing the glass plate 82 is bonded to the light modulation film 1 with an adhesive layer 90 interposed therebetween.

In other words, on the inner surface of one glass plate 81, the adhesive layer 90, the polymer film substrate 10, the light modulation layer 30 and the catalyst layer 40 are arranged in this order from the glass plate 81 side. The light modulation film may include a buffer layer between the light modulation layer 30 and the catalyst layer 40, and may have a surface layer on the catalyst layer.

In the multi-layered glass 100, a gap between two glass plates 81 and 82 forms a gas-filling chamber S, and an end portion thereof is sealed with a sealing member 85. An inert gas such as, for example, argon is encapsulated in the gas-filling chamber S in advance. An opening is provided in the glass plate 82, and the gas-filling chamber S is spatially connected to an atmosphere control device 86.

The atmosphere control device 86 is configured such that hydrogen, and oxygen or air can be supplied to and discharged from the gas-filling chamber S. For example, the atmosphere control device 86 can be configured such that electrolysis of water is performed to supply hydrogen and oxygen, and the gas in the gas-filling chamber S is discharged to the outside using a vacuum pump.

When hydrogen is supplied in the form of a gas from the atmosphere control device 86 to the gas-filling chamber S, the light modulation layer 30 is hydrogenated through the catalyst layer 40 to turn into a transparent state. In addition, when an oxygen gas or air is supplied from the atmosphere control device 86 to the gas-filling chamber S, the light modulation layer 30 is dehydrogenated through the catalyst layer 40 and the buffer layer 50 to turn into a reflective state. Thus, by supplying a gas to and discharging a gas from the atmosphere control device 86, the atmosphere in the gas-filling chamber S can be controlled to reversibly switch between the transparent state and the reflective state. In addition, when supply and discharge of a gas is interrupted, the state can be kept unchanged.

Although the gas-filling chamber S and the atmosphere control device 86 are connected to each other through the opening provided in the glass plate 82 in the embodiment shown in FIG. 3, the atmosphere control device may be connected through an opening or the like provided in a sealing member. An atmosphere controller capable of generating a hydrogen gas and an oxygen gas may be disposed in the gas-filling chamber S. In addition, in the embodiment shown in FIG. 3, the light modulation film is bonded onto only one glass plate 81, but the light modulation film may also be bonded onto the glass plate 82.

EXAMPLES

Hereinafter, the present invention will be described more in detail by showing examples, but the present invention is not limited to the following examples.

Example 1

A roll of a 188 μm-thick polyethylene terephthalate (PET) film (manufactured by Mitsubishi Plastics, Inc.) was set in a roll-to-roll sputtering apparatus, and the inside of a sputtering apparatus was evacuated until the ultimate vacuum degree reached $5 \times 10^{-3}$ Pa. The PET film substrate was conveyed in the sputtering apparatus without introducing a sputtering gas, and as a result, the internal pressure of the apparatus increased to $4 \times 10^{-2}$ Pa. This is because residual gas contained in the PET film was released into the sputtering apparatus.

Thereafter, a sputtering gas was introduced into the sputtering apparatus, and a light modulation layer including an Mg—Y alloy and a catalyst layer including Pd were sequentially deposited while the film substrate was run on a deposition roll.

An Mg—Y split target (manufactured by RARE METALLIC Co., Ltd.) having an Mg metal plate and a Y metal plate at an erosion portion area ratio of 2:5 was used for deposition of the Mg—Y alloy layer. Argon was introduced as a sputtering gas, and sputtering deposition (power source: DC) was performed under a vacuum environment at a pressure of 0.4 Pa. A Pd metal target (manufactured by Tanaka Kikinzoku Kogyo) was used for deposition of the Pd layer. Argon was introduced as a sputtering gas, and sputtering deposition (power source: DC) was performed under a vacuum environment at a pressure of 0.4 Pa.

Figure 4:
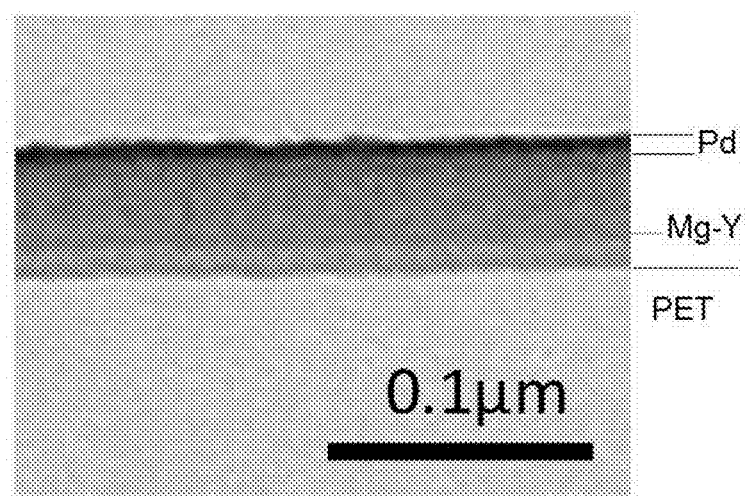
FIG. 4 is TEM observation image of a cross-section of a light modulation film in an example.

In the resulting light modulation film, the thickness of the Mg—Y alloy layer was 40 nm, and the thickness of the Pd layer was 7 nm. FIG. 4 shows an observation image of a cross-section of the light modulation film under a tunnel scanning electron microscope (TEM). FIG. 4 show that a region with a different contrast exists on the substrate side of the Mg—Y layer, and thus an oxidized region is formed. It is considered that this oxidized region was generated due to oxidation of the metal by a residual gas released from the PET film.

Example 2

Except that the ultimate vacuum degree before the start of sputtering deposition was $8 \times 10^{-4}$ Pa, the same procedure as in Example 1 was carried out to prepare a light modulation film.

Example 3

Except that the conditions for deposition of the light modulation layer were changed as described below, the same procedure as in Example 1 was carried out to prepare a light modulation film. In deposition of an Mg—Y alloy layer, first the Mg—Y alloy layer was formed in a thickness of 25 nm under 0.4 Pa vacuum environment in which 5% of oxygen in terms of a flow rate was introduced in argon as a sputtering gas. Subsequently, an Mg—Y alloy layer was formed in a thickness of 40 nm under an environment at 0.4 Pa with only argon introduced as a sputtering gas.

Comparative Example 1

Except that the thickness of the Mg—Y alloy layer was 20 nm, the same procedure as in Example 1 was carried out to prepare a light modulation film.

[Evaluation of Light Modulation Performance]

The light modulation films of Examples and the Comparative Example were in a metallic luster reflective state. The results of visual inspection showed that the light modulation films of Examples 1 to 3 turned to a transparent state when exposed to a hydrogen gas atmosphere at 1 atm with the hydrogen gas diluted to 4% by volume with argon (light modulation performance: OK). On the other hand, the light modulation film of Comparative Example 1 did not turn into a transparent state even when exposed to a hydrogen gas atmosphere, and thus the light modulation film did not have light modulation performance (light modulation performance: NG). After the light transmittances of the light modulation films of Examples and the Comparative Examples were measured under a hydrogen gas atmosphere, the light modulation films were then returned to an air atmosphere, and dehydrated, and the light transmittances of these light modulation films were measured again. For measurement of the light transmittance, a light emitting diode (EL-1KL3 (peak wavelength: about 940 nm) manufactured by KODENSHI CORP.) was used as a light source, and a photodiode (SP-1ML manufactured by KODENSHI CORP.) was used as a light receiving element. There is almost no difference between transmittances of the light modulation film at a wavelength of 940 nm and at a wavelength of 750 nm which corresponds to a visible light region. The difference between light transmittances in a hydrogenated state (transparent state) and in a dehydrogenated state (reflected state) was defined as light modulation performance.

Table 1 shows the thickness and light modulation performance of each layer in the light modulation film of each Example and the Comparative Example. In Table 1, the thickness of the entire light modulation layer (Mg—Y) and the thickness of the catalyst layer (Pd) were determined by TEM observation of a cross-section, and the thickness of each of the oxidized region and the light modulation region was determined from an XPS depth profile of an oxygen concentration (described later).

TABLE 1

| | thickness (nm) | | | | light modulation performance | |
|---|---|---|---|---|---|---|
| | Mg—Y | | | | | |
| | entire | oxidized region | light modulation region | Pd | | |
| Example 1 | 40 | 18 | 22 | 7 | OK | 30.5% |
| Example 2 | 40 | 12 | 28 | 7 | OK | 33.0% |
| Example 3 | 65 | 25 | 40 | 7 | OK | 36.6% |
| Comparative Example 1 | 15 | — | 5 | 7 | NG | 0% |

[Measurement of Thickness of Oxidized Region in Light Modulation Layer]

An oxygen concentration distribution in the light modulation layer was determined by performing depth profile measurement using a scanning X-ray photoelectron spectrometer equipped with an Ar ion etching gun ("Quantum 2000" manufactured by ULVAC-PHI, Inc.). In analysis of the depth profile, a position which is situated between the light modulation layer and the catalyst layer and at which the Pd element concentration is a half value of the maximum value of the Pd element concentration in the catalyst layer was defined as an interface between the catalyst layer and the light modulation layer (start point of the light modulation layer); and a position which is situated between the light modulation layer and the polymer film substrate and at which the C element concentration is a half value of the maximum value of the C element concentration in the polymer film substrate was defined as an interface between the light modulation layer and the polymer film substrate. The thickness (depth) in the depth profile was calculated by converting the etching time into the depth on the basis of the Ar ion etching rate of the silicon oxide layer. From the resulting depth profile, the thickness of a region (oxidized region) having an oxygen concentration of 50 atom % or more on the polymer film substrate side of the light modulation layer was determined.

While there was no difference in thickness of the light modulation layer (Mg—Y layer) between Example 1 and Example 2, Example 2 in which the oxidized region had a smaller thickness, and the light modulation region had a larger thickness showed higher light modulation performance. The above-described results show that even when a film substrate is used, a light modulation film capable of switching between a transparent state and a reflective state by hydrogenation and dehydrogenation is obtained by increasing the thickness of the light modulation region in spite of the thickness of the oxidized region in the light modulation layer.

DESCRIPTION OF REFERENCE CHARACTERS

1, 2 light modulation film
10, 12 polymer film substrate
30 light modulation layer
31 oxidized region
32 modulation region
40 catalyst layer
50 buffer layer
70 surface layer
100 multi-layered glass
81, 82 glass plate
85 sealing member
86 atmosphere control device
90 adhesive layer

The invention claimed is:

1. A light modulation film comprising:
   a polymer film substrate;
   a light modulation layer whose state is reversibly changed between a transparent state by hydrogenation and a reflective state by dehydrogenation, and
   a catalyst layer that promotes hydrogenation and dehydrogenation in the light modulation layer, in this order on the polymer film substrate, wherein
      the light modulation layer includes: a light modulation region whose oxygen content is less than 50 atom % on a catalyst layer side; and an oxidized region whose oxygen content is 50 atom % or more, and
      a thickness of the light modulation region is 10 nm or more.

2. The light modulation film according to claim 1, wherein the oxidized region in the light modulation layer has a thickness of 2 to 100 nm.

3. The light modulation film according to claim 1, wherein in the light modulation layer, the oxidized region and the light modulation region have the same metal element composition.

4. The light modulation film according to claim 1, wherein the light modulation layer is a thin-film that includes a metal or a hydride or a oxide of the metal,
   the metal is selected from the group consisting of a rare earth metal, an alloy of a rare earth metal and magnesium, an alloy of an alkaline earth metal and magnesium, and an alloy of a transition metal and magnesium.

5. The light modulation film according to claim 1, wherein in the light modulation layer, a thickness of the oxidized region is smaller than a thickness of the light modulation region.

6. The light modulation film according to claim 1, wherein the oxidized region in the light modulation layer has a thickness of 4 to 80 nm.

7. The light modulation film according to claim 1, wherein the oxidized region in the light modulation layer has a thickness of 6 to 60 nm.

8. The light modulation film according to claim 1, wherein the light modulation layer is a thin-film that includes an alloy of a rare earth metal and magnesium or a hydride or an oxide of the alloy.

9. The light modulation film according to claim 1, wherein the light modulation layer is a thin-film that includes an alloy of yttrium and magnesium or a hydride or an oxide of the alloy.

10. A method for manufacturing the light modulation film provided in claim 1, wherein
   the light modulation layer including the oxidized region and the light modulation region, and the catalyst layer are deposited on the film substrate by a roll-to-roll sputtering.

11. A light modulation element comprising:
   a plurality of transparent members, the transparent members are arranged to have a gap that constitutes a gas-filling chamber, and a light modulation film is disposed in the gas-filling chamber,
   wherein the light modulation film comprises: a polymer film substrate; a light modulation layer whose state is reversibly changed between a transparent state by hydrogenation and a reflective state by dehydrogenation, and a catalyst layer that promotes hydrogenation and dehydrogenation in the light modulation layer, in this order on the polymer film substrate, wherein
   the light modulation layer includes: a light modulation region whose oxygen content is less than 50 atom % on a catalyst layer side; and an oxidized region whose oxygen content is 50 atom % or more, and
   a thickness of the light modulation region is 10 nm or more.

12. The light modulation element according to claim 11, further comprising an atmosphere control device configured such that hydrogen can be supplied to and discharged from the gas-filling chamber.

* * * * *